United States Patent [19]

Ichimiya et al.

[11] 4,402,081
[45] Aug. 30, 1983

[54] SEMICONDUCTOR MEMORY TEST PATTERN GENERATING APPARATUS

[75] Inventors: Yoshichika Ichimiya, Tokorozawa; Tsuneta Sudo, Kodaira; Masao Shimizu, Gyoda, all of Japan

[73] Assignees: Nippon Telegraph & Telephone Public Corp.; Takeda Riken Kogyo Kabushiki Kaisha, both of Tokyo, Japan

[21] Appl. No.: 195,079

[22] Filed: Oct. 8, 1980

[30] Foreign Application Priority Data

Oct. 19, 1979 [JP] Japan ............................... 54-135532

[51] Int. Cl.³ ............................................. G06F 11/00
[52] U.S. Cl. ........................................ 371/21; 371/27
[58] Field of Search ................... 371/21, 27; 324/73 R

[56] References Cited

U.S. PATENT DOCUMENTS 4,263,669  4/1981  Starger et al. ......................... 371/27
4,293,950 10/1981  Shimizu et al. ....................... 371/21
4,300,234 11/1981  Maruyama et al. ................... 371/27

OTHER PUBLICATIONS

Geffken "Memory Tester Pattern Generator" *IBM Tech. Disclosure Bulletin* vol. 20, No. 2 Jul. 1977, pp 535–536.

*Primary Examiner*—David H. Malzahn
*Attorney, Agent, or Firm*—Staas & Halsey

[57] ABSTRACT

A semiconductor memory test pattern generating apparatus in which an instruction memory is read out, assigning an address by a program counter, and instructions thus read out are decoded and executed to generate a test pattern. A start address and a stop address and index data indicating the number of times of executing an area defined by the start and stop addresses are stored in a loop memory. During the operation of the program counter the start and stop addresses and the index data are read out from the loop memory and loaded in a register group. When the program counter coincides with the loaded stop address, the setting of the program counter to the loaded start address is executed by the number of times indicated by the loaded index data, and in the last execution the next address of the loop memory is read out.

7 Claims, 6 Drawing Figures

SEMICONDUCTOR MEMORY TEST PATTERN GENERATING APPARATUS

BACKGROUND OF THE INVENTION

The present invention relates to a test pattern generating apparatus which generates galloping, walking and various other test patterns for testing semiconductor memories.

Conventional semiconductor memory test pattern generating apparatuses have such a construction as proposed, for example, in U.S. patent application Ser. No. 26,246 now U.S. Pat. No. 4,293,950, (filed Apr. 2, 1979) entitled "Test Pattern Generating Apparatus." In such a prior art example, an instruction memory is read out by an address from an address counter and an address generating instruction in the output read out from the instruction memory is decoded and executed by an address generator to generate an address pattern. A data generating instruction in the read output is decoded and executed by a data generator to generate a data pattern. A memory under test is accessed by the address pattern to read it out or to write therein the data pattern. Status information from the address generator and the data generator, such as the address pattern and the data pattern therefrom, and a conditional branch instruction in the output read out from the instruction memory are provided to a control circuit. By a control signal from the control circuit, the address counter is controlled to step or set its content to a jump address in the output read out from the instruction memory.

With such a conventional test pattern generating apparatus, since the time for obtaining the abovesaid control signal is included in the operation period from the execution of an instruction to the execution of the next instruction, it is difficult to generate test patterns at high speed. If the test is conducted at high speed, when the abovesaid jump takes place, there occurs what is called a dummy cycle in which no test pattern is applied to the memory under test. An appreciable number of test patterns repeat the same sequence from a certain address to another address of the memory under test, such as galloping, walking and like patterns. In the case of repeating the same sequence, the address counter of the instruction memory is usually jump-controlled, so that in the high-speed test, the dummy cycle often occurs, resulting in the test becoming undesirably lengthy.

SUMMARY OF THE INVENTION

It is an object of the present invention to provide a semiconductor memory pattern generating apparatus which is capable of generating test patterns at high speed.

Another object of the present invention is to provide a semiconductor memory test pattern generating apparatus which permits high-speed generation of test patterns of the type including repetition of the same sequence.

Yet another object of the present invention is to provide a semiconductor memory test pattern generating apparatus which permits high-speed generation of complex text patterns wherein repetition of the same sequence is multiplexed.

According to the present invention, a start and a stop address indicating an area to be accessed, index data indicating the number of times of accessing the area, and loop data indicating whether or not a start and a stop address of another loop to be accessed are included between the start and the stop address, are written in a loop memory, and a plurality of sets of such data are written in the loop memory in the order of execution. One of the sets is read out from the loop memory to load the data in a start address register, a stop address register and an index data register, respectively. An instruction memory in which is loaded a microprogram having described therein a test pattern is accessed in accordance with the content of a program counter. When coincidence is detected between the address of the program counter and the content of the stop address register, the start address in the address register is set by a coincidence output into the program counter to start the incrementing of the program counter again, this is repeated by the number of times indicated by the data set in the index data register. By providing a plurality of sets of such start address registers, stop address registers and index data registers and by using a loop data register, it is also easy to arrange a double loop so that a certain area within, for example, the abovementioned access area is accessed a predetermined number of times each time the abovesaid access area is accessed. In the case of providing such a plurality of sets of registers, by reading out the loop memory and loading the read output into another set of registers during the generation of a single-loop or double-loop pattern, various loop patterns can be generated with no dummy cycle.

DESCRIPTION OF THE PREFERRED EMBODIMENTS

To facilitate a better understanding of the present invention, a description will be given of a conventional test pattern generating apparatus.

Figure 1:
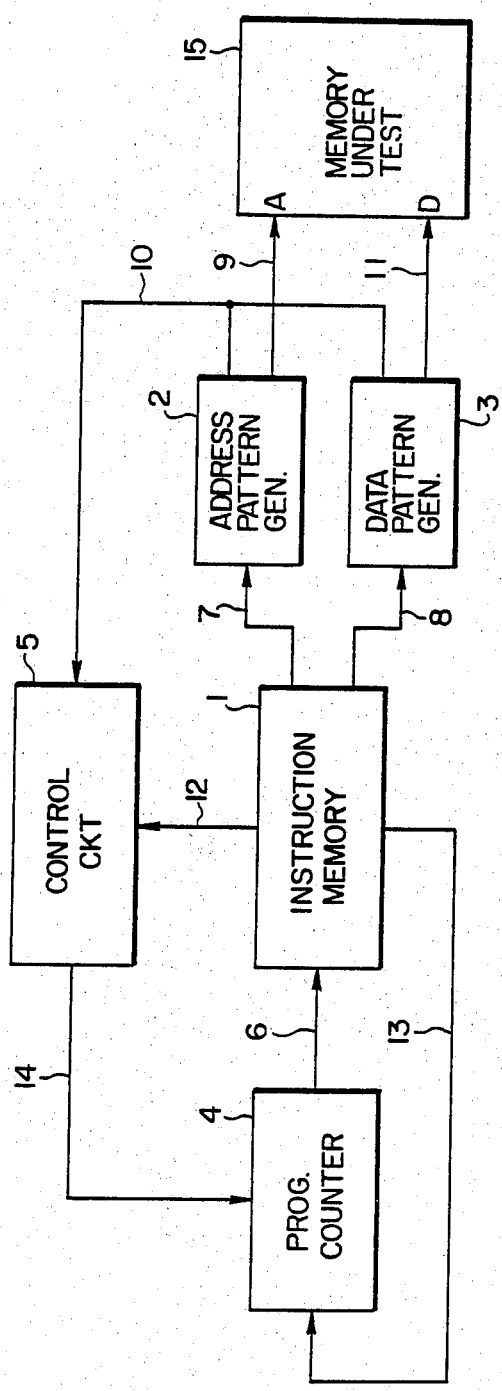
FIG. 1 is a block diagram showing a conventional pattern generating apparatus.

A prior art test pattern generating apparatus for testing a semiconductor memory has a construction as shown in FIG. 1, which is described in detail, for example, in the aforementioned U.S. patent application. The test pattern generating apparatus comprises an instruction memory 1 which is loaded with a microprogram describing test patterns to be generated, an address pattern generator 2 which interprets an instruction from the instruction memory 1 to generate an address pattern for accessing a memory under test 15, a data pattern generator 3 which interprets an instruction from the instruction memory 1 to generate a data pattern to be applied to the memory under test 15, a program counter 4 which generates an address for accessing the instruction memory 1, and a control circuit 5 which controls the program counter 4 in response to an instruction from the instruction memory 1, an address from the address pattern generator 2 and data from the data pattern generator 3.

The instruction memory 1 is accessed by a memory address 6 from the program counter 4 to provide an address generating instruction 7 to the address pattern generator 2, a data generating instruction 8 to the data pattern generator 3, a jump address 13 to the program counter 4 and an instruction 12 to the control circuit 5. The address pattern generator 2 interprets the address generating instruction 7 from the instruction memory 1 to execute a predetermined arithmetic operation, outputting an address pattern 9 to the memory under test 15 and several kinds of status information 10 indicating the status of the address pattern generator 2. The data pattern generator 3 interprets the data generating instruction 8 from the instruction memory 1 to execute an arithmetic operation, outputting a data pattern 11 to the memory 15 under test and several kinds of status information 10 indicating the status of the data pattern generator 3. The control circuit 5 generates, in accordance with the instruction 12 from the instruction memory 1 and the status information 10 from the address pattern generator 2 and the data pattern generator 3, a control signal 14 for controlling the operation of the program counter 4.

The program counter 4 is controlled by the control signal 14 from the control circuit 5 to provide, as the next memory address 6, the jump address 13 from the instruction memory 1 or the address next to the address which is being outputted. During operation the memory address 6 is applied from the program counter 4 to the instruction memory 1 to read out therefrom the content stored in the address indicated by the memory address 6, applying the address generating instruction 7, the data generating instruction 8, the instruction 12 and the jump address 13 in the read output to the address pattern generator 2, the data pattern generator 3, the control circuit 5 and the program counter 4, respectively. The address pattern generator 2 and the data pattern generator 3 respectively interpret the address generating instruction 7 and the data generating instruction 8 to execute predetermined arithmetic operations, providing the address pattern 9 and the data pattern 11 to the memory 15 under text and the status information 10 such as an address pattern, a data pattern, etc. to the control circuit 5. The data pattern generator 3 interprets and executes the data generating instruction from the instruction memory 1 to provide the data pattern 11 to the memory 15 under test.

Based on the instruction 12 from the instruction memory 1 and the status information 10, the control circuit 5 applies to the program counter 4 the control signal 14 for controlling the address of the instruction memory 1 to be accessed next. The program counter 4 outputs, as the memory address 6, an address next to the memory address 6 being outputted or the jump address 13 from the instruction memory 1 depending on whether the control signal 14 is "0" or "1."

Figure 2:
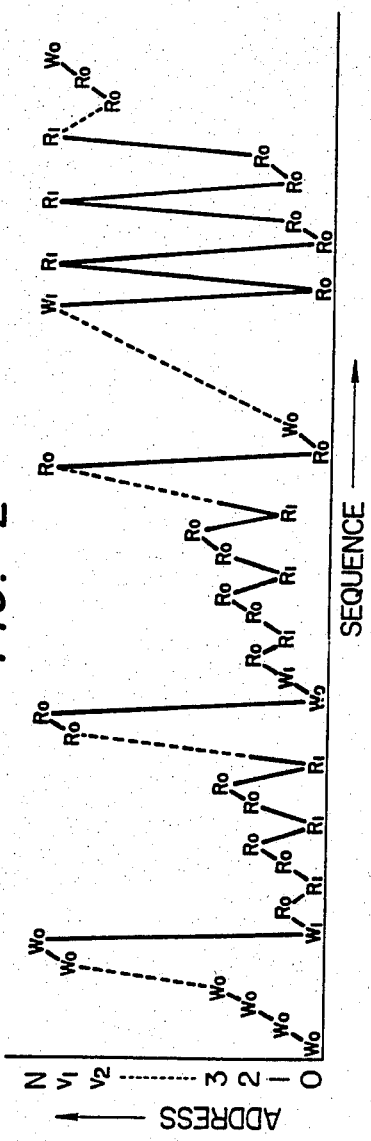
FIG. 2 is a diagram showing the sequence of a galloping pattern.

FIG. 2 shows the sequence of a galloping pattern used as a test pattern for a semiconductor memory. In FIG. 2, the ordinate represents addresses applied to the memory 15 under test and the abscissa represents access sequence. Reference character N indicates a maximum address of the memory 15 under test, $W_0$ and $W_1$ respectively show accesses for writing data 0 and 1 in the addresses shown on the left-hand side, and $R_0$ and $R_1$ respectively show accesses for reading out from the addresses the data 0 and 1.

The galloping pattern can be obtained in such a manner as shown in FIG. 2. At first "0" is written in all addresses 0 to N of the memory 15 under test; "1" is written in the address 0, using it as a reference address; all the addresses 0 to N are read out in the order of address 1—reference address (address 0)—address 1; address 2—reference address (address 0)—address 2; address 3—reference address (address 0)—address 3; . . . ; and then "0" is written in the reference address, thus restoring all the addresses to "0." Thereafter, the above sequence is repeated, using as the reference address the addresses 1 to N one after another.

With the conventional pattern generator, the galloping pattern is generated in the following manner. At first, the data "0" is written in all the addresses of the memory under test by executing a data "0" writing instruction N times while incrementing the address of the memory and, after executing an instruction for writing data "1" in the reference address, a set of three instructions for reading out a triad of addresses in the order address M- reference address-address M are executed, using as the address M the addresses 0 to N one after another except the reference address, and then an instruction for writing "0" in the reference address is executed. In this way, the above sequence is executed, using as the reference address the addresses 0 to N in a sequential order.

In the prior art pattern generator, for executing the same instructions N and M times in the above-described manner, use is made of a method of controlling the program counter 4 by the status information 10, such as the address data and the data pattern data from the address pattern generator 2 and the data pattern generator 3 and the instruction 12 from the instruction memory 1, to execute the same instruction N times and a specific instruction group M times.

Since the conventional semiconductor memory test pattern generating apparatus adopts a method that interprets the program described in the instruction memory to generate the address pattern and the data pattern and, at the same time, produces the control signal 14 by the status information from the address pattern generator and the data pattern generator and a conditional branch instruction described in the instruction memory, and then accesses an instruction to be executed next, as described above, the operation period from the execution of one instruction to the execution of the next instruction includes the time for obtaining the control signal 14, making it difficult to achieve a high-speed operation.

Figure 3:
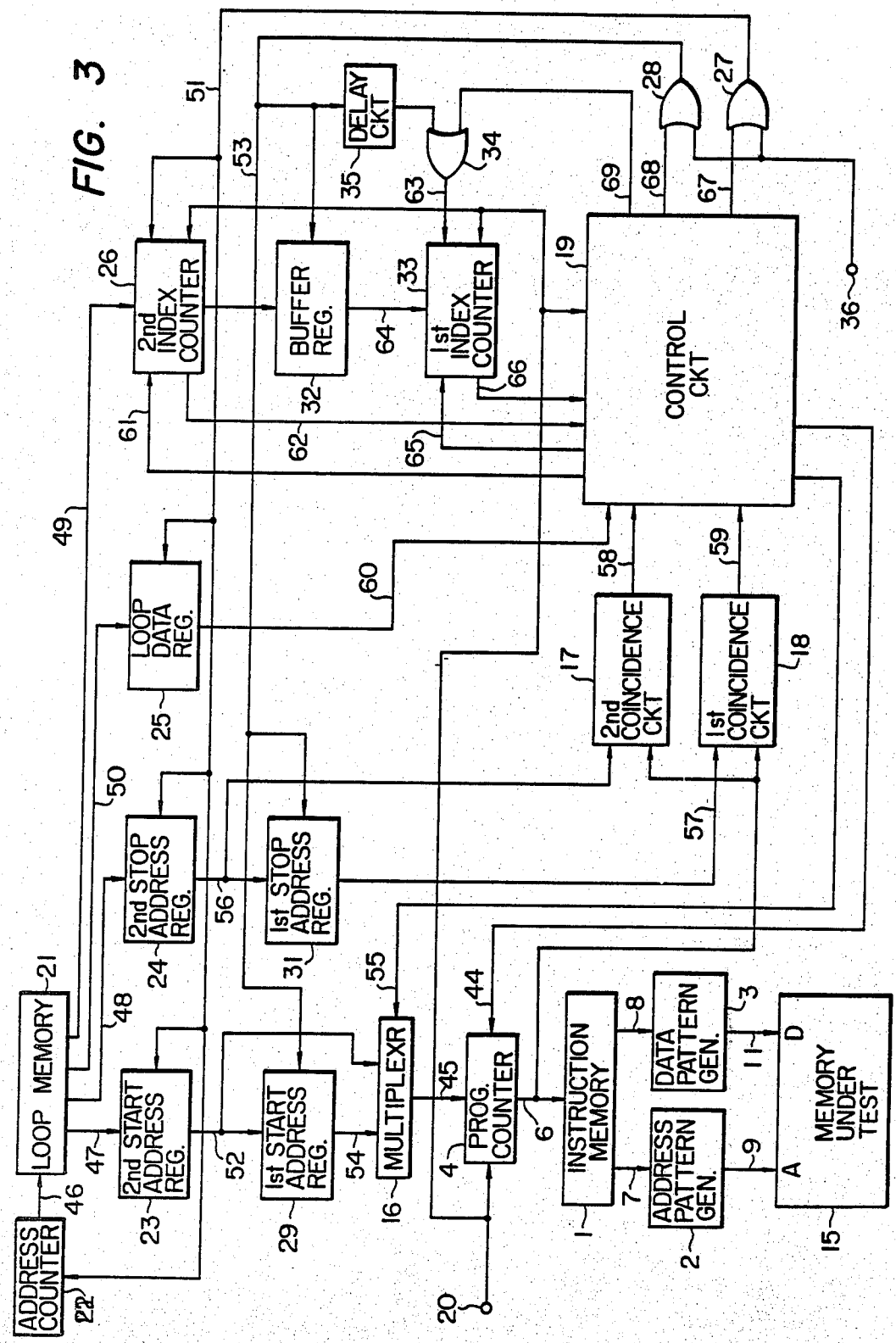
FIG. 3 is a block diagram illustrating an embodiment of the test pattern generating apparatus of the present invention.

FIG. 3 illustrates an embodiment of the test pattern generating apparatus of the present invention. In FIG. 3, the instruction memory 1, the address pattern generator 2 and the data pattern generator 3 are identical to those shown in FIG. 1. The program counter 4 generates the memory address 6 for accessing the instruction memory 1. The program counter 4 has a function of incrementing its content in synchronism with an operating clock of a terminal 20 or loading a start address 45 from a multiplexer 16 depending on whether a control signal 44 from a control circuit 19 is "0" or "1." The output from the program counter 4 is applied as the memory address 6 to the instruction memory 1 and first and second coincidence circuits 18 and 17.

A loop memory 21 loads start and stop addresses indicating an area of the instruction memory 1 to be accessed, index data indicating the number of times of accessing the area and loop data indicating whether or not start and stop addresses for other loops are included between the abovesaid start and stop addresses. The loop memory 21 is accessed by an address 46 from an address counter 22 to apply a start address 47, a stop address 48, index data 49 and loop data 50 stored in the accessed address to a second start address register 23, a second stop address register 24, a second index counter 26 and a loop data register 25, respectively. The address counter 22 generates the address 46 for accessing the loop memory 21 and increments its content by a second (denoting the correspondence to the "second" start and stop address registers, etc.) request signal 51 from an OR circuit 27. The second start address register 23 loads the start address 47 from the loop memory 21 in response to the second rquest signal 51 from the OR circuit 27, and applies its output 47 as a second start address 52 to a first start address register 29 and the multiplexer 16. The first start address register 29 loads the second start address 52 in response to a first request signal 53 from an OR circuit 28 and applies its output as a first start address 54 to the multiplexer 16.

The multiplexer 16 selects one of the first and second start addresses 54 and 52 as the start address 45 for the program counter 4. Namely, the multiplexer 16 provides, as the start address 45, the first start address 54 or the second start address 52 depending on whether a control signal 55 from the control circuit 19 is "0" or "1", respectively. The second stop address register 24 responds to the second request signal 51 to load the stop address 48 from the loop memory 21 and provide, as its output, a second stop address 56 to a first stop address register 31 and the second coincidence circuit 17. The first stop address register 31 responds to the first request signal 53 from the OR circuit 28 to load the second stop address 56 and apply it as a first stop address 57 to the first coincidence circuit 18. The second coincidence circuit 17 compares the memory address 6 and the second stop address 56 and, in the case of coincidence, yields a second coincidence signal 58. The first coincidence circuit 18 compares the memory address 6 and the first stop address 57 and, in the case of coincidence, produces a first coincidence signal 59.

The loop data register 25 loads loop data indicating that the first start address 54 and the first stop address 57 are included in the area defined by the second start address 52 and the second stop address 56. The loop data register 25 responds to the second request signal 51 from the OR circuit 27 to load the loop data 50 from the loop memory 21 and provides, as its output, loop data 60 to the control circuit 19. The second index counter 26 indicates the number of times of accessing the area defined by the second start address 52 and the second stop address 56 and responds to the second request signal 51 from the OR circuit 27 to load the index data 49. Further, the second index counter 26 responds to a second DEC signal 61 from the control circuit 19 to decrement its content in synchronism with the operating clock at the terminal 20 and applies a second ZERO signal 62 to the control circuit 19 when decremented to "0."

A buffer register 32 loads the content of the second index counter 26 upon occurrence of the first request signal 53 from the OR circuit 28. A first index counter 33 indicates the number of times of accessing the area defined by the first start address 54 and the first stop address 57 and responds to a load signal 63 from an OR circuit 34 to load buffer data 64 from the buffer register 32. Further, the index counter 33 also responds to a first DEC signal 65 from the control circuit 19 to decrement its content in synchronism with the operating clock at the terminal 20 and provides a first ZERO signal 66 to the control circuit 19 when decremented to "0." The output from the OR circuit 28 is provided via a delay circuit 35 to the OR circuit 34. Terminal 36 is applied with an initial clock for loading, at the start of operation, in the respective registers the start address, the stop address, the index data and the loop data described in the loop memory 21.

Figure 4:
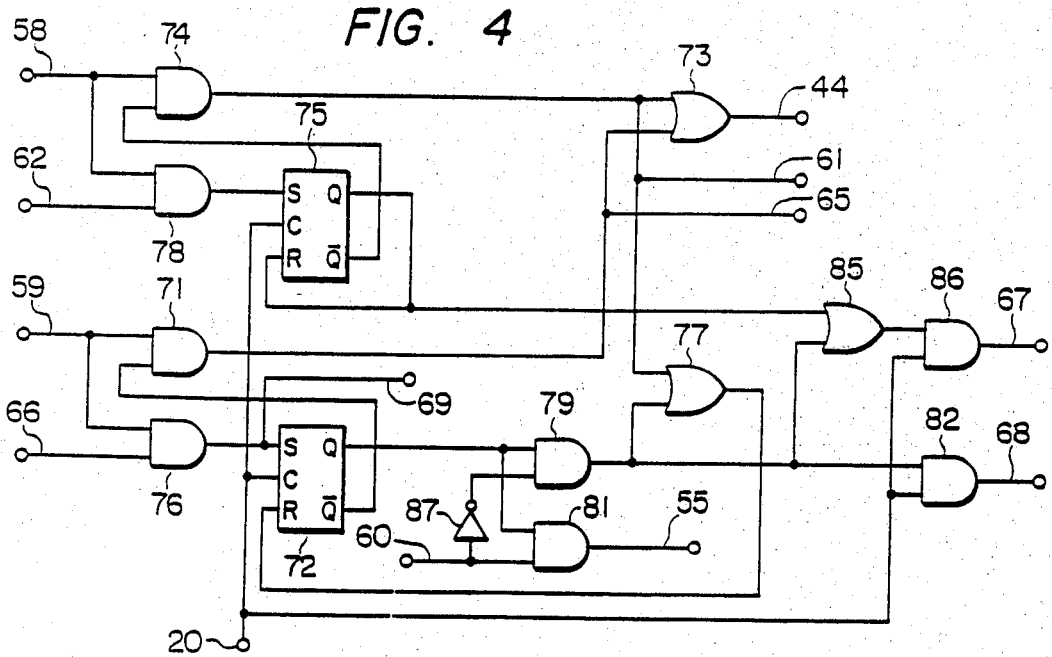
FIG. 4 is a logic circuit diagram illustrating in detail an example of a control circuit 19 used in the embodiment of FIG. 3.

FIG. 4 illustrates in detail the circuit arrangement of the control circuit 19. When the first coincidence signal 59 is obtained and a flip-flop 72 is reset, an AND circuit 71 produces the first DEC signal 65 for decrementing the first index counter 33 and, at the same time, yields via an OR circuit 73 the control signal 44 for loading the start address 45 in the program counter 4. When the second coincidence signal 58 is provided and a flip-flop 75 is reset, an AND circuit 74 produces the second DEC signal 61 for decrementing the second index counter 26 and, at the same time, yields via the OR circuit 73 the control signal 44 for loading the start address 45 in the program counter 4. The flip-flops 72 and 75 are both synchronous set/reset flip-flops. The flip-flop 72 is set via an AND circuit 76 in synchronism with the operating clock at the terminal 20 when the first coincidence signal 59 is provided and the first ZERO signal 66 is "1;" and when the second coincidence signal 58 is provided and the flip-flop 75 is not set, or when the loop data 60 is "0" and the flip-flop 72 is set, the flip-flop 72 is reset via an OR circuit 77 in synchronism with the operating clock at the terminal 20. The flip-flop 75 is set via an AND circuit 78 in synchronism with the operating clock at the terminal 20 when the second coincidence signal 58 is provided and the second ZERO signal 62 is "1," and the flip-flop 75 thus set is reset by the next operating clock.

The Q output from the flip-flop 72 is applied to AND circuits 79 and 81. When the loop data 60 from the loop data register 25 is "0," the first request signal 68 is applied via AND circuits 79 and 82 to the OR circuit 28 (FIG. 3), and the second request signal 67 is applied to the OR circuit 27 (FIG. 3) via the AND circuit 79, an OR circuit 85 and an AND circuit 86. When the loop data 60 is "1," the AND circuit 79 is inhibited by an inverter 87 and neither of the request signals 68 and 67 is outputted, but the select signal 55 is provided to the multiplexer 16 for outputting therefrom, as the start address 45, the start address 52 from the second start address register 23. The Q output from the flip-flop 75 is applied as the second request signal 67 to the OR circuit 27 (FIG. 3) via the OR circuit 85 and the AND circuit 86.

Figure 5:
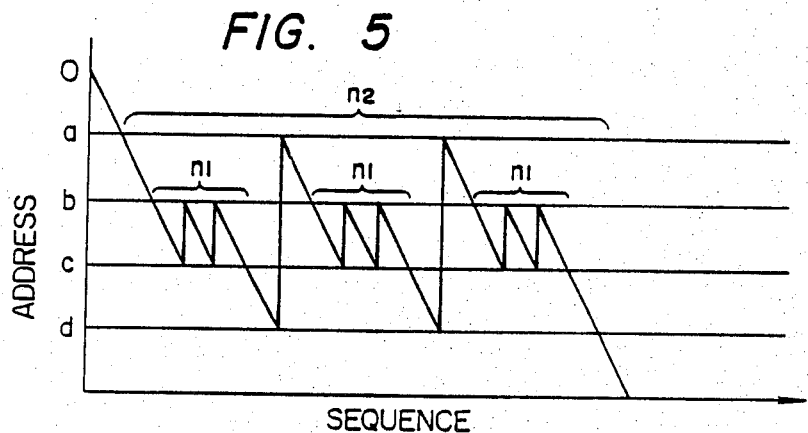
FIG. 5 is a diagram showing an example of the sequence of a test pattern.
Figure 6:
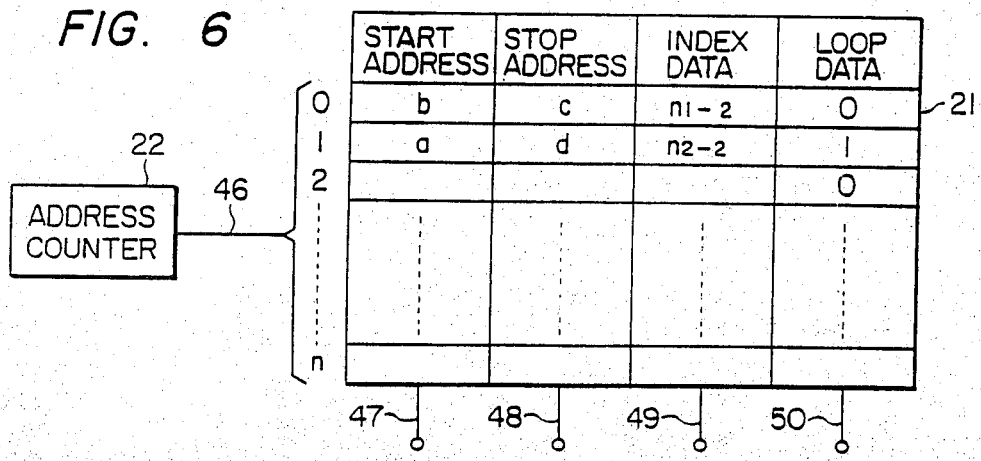
FIG. 6 is a diagram showing an example of the stored content of a loop memory employed in the embodiment of FIG. 3.

FIG. 5 shows an example of an address sequence of the instruction memory 1 which is generated by the test pattern generating apparatus of FIG. 3. As shown in FIG. 5, after an access is made from an address 0 to an address a and thence to an address b, an access is made from the address b to an address c n1 times and thence to an address d, thereafter returning to the address a. This sequence is executed n2 times in all. FIG. 6 shows start addresses, stop addresses, index data and loop data which are described in the loop memory 21 for generating the sequence shown in FIG. 5.

Next, a description will be given of the operation of FIG. 3 in connection with the case of generating the address sequence for the instruction memory, shown in FIG. 5. Prior to the starting of operation, the data shown in FIG. 6 are transferred to the loop memory 21 and "0" is set in the program counter 4. At the start of operation, the initial clock is applied to the terminal 36 twice to read out data stored in addresses 0 and 1 of the loop memory 21. Thus setting by the first and second request signals 53 and 51, b in the first start address register 29, a in the second start address register 23, c in the first stop address register 31, d in the second stop address register 24, "1" in the loop data register 25, n2-2 in the second index counter 26, n1-2 in the buffer register 32 and n1-2 in the first index counter 33.

Next, when the operating clock is applied to the terminal 20, the program counter 4 increments in synchronism with the operating clock while the control signal 44 is "0." Then, when the memory address 6 from the program counter 4 coincides with the stop address c loaded in the first stop address register 31, the first coincidence signal 59 from the first coincidence circuit 18 become "1" and is provided to the AND circuit 71 (FIG. 4). At this time, since the flip-flop 72 (FIG. 4) is not set, and AND circuit 71 applies the coincidence signal as the control signal 44 to the program counter 4 (FIG. 3) and as the first DEC signal 65 to the first index counter 33.

By the control signal 44 being "1", the start address b stored in the first start address register 29 is loaded in the program counter 4 via the multiplexer 16. When the address b is set in the program counter 4, the memory address 6 becomes b and the first coincidence signal 59 from the first coincidence circuit 18 becomes "0," so that the control signal 44 also becomes "0," returning the program counter 4 to the incrementing mode. On the other hand, when the first coincidence signal 59 from the first coincidence circuit 18 is "1," the first DEC signal 65 is applied from the AND circuit 71 (FIG. 4) to the first index counter 33 (FIG. 3) to cause it to decrement in synchronism with the operating clock.

Next, when the content of the first index counter 33 becomes "0" and the first ZERO signal 66 is provided to the control circuit 19 and the memory address 6 matches with the stop address c to yield the first coincidence signal 59, the control signal 44 is supplied via the AND circuit 71 (FIG. 4) and the OR circuit 73 (FIG. 4) to the program counter 4 (FIG. 3) to load therein the start address b. Thereafter, the flip-flop 72 (FIG. 4) is set by the output from the AND circuit in synchronism with the operating clock (20), and the data from the AND circuit 76 is applied as a buffer load signal 69 to the OR circuit 34 (FIG. 3) and the data n1-2 stored in the buffer register 32 is loaded in the first index counter 33.

The Q terminal of the flip-flop 72 (FIG. 4) is connected to the AND circuits 79 and 81, and the Q terminal is connected to the AND circuit 71, which inhibits the first coincidence signal 59 after the flip-flop 72 is set. Accordingly, the memory address from the program counter 4 proceeds to an address c+1 next to the address c. Upon setting of the flip-flop 72, since the loop data 60 from the loop data register 25 (FIG. 3) is "1," the AND circuit 81 (FIG. 4) applies to the multiplexer 16 (FIG. 3) the control signal 55 for selecting a in the second start address register 23.

As explained above, when an address produced by the program counter 4 coincides with the first stop address c, the first start address b is loaded in program counter 4 (i.e., a jump operation is implemented) at the same time the content of the first index counter 33 is decremented. However, despite the fact that the address produced by the program counter 4 coincides with the first stop address c with the first index counter 33 being "0," the flip-flop 72 is not set until the operating clock is supplied thereto. Therefore, the coincidence signal 59 instantly causes to produce a control signal 44 via the AND circuit 71 and the OR circuit 73, and thereafter the flip-flop 72 is set in synchronism with the first operating clock from the terminal 20 after the set signal from the gate circuit 76 is supplied to the flip-flop 72. This means that even though the content of the first index counter 33 becomes "0," another loading of the first start address to the program counter 4 takes place. Accordingly, the jump operations are carried out a number of times one more than the set value $(n_1-2)$ in the first index counter 33, that is, if the jump operation between the addresses b and c is performed $(n_1-1)$ times, then this allows access between the addresses b and c $n_1$ times. Consequently, according to the practical embodiment shown in FIGS. 3 and 4, in order to access the addresses between b and c $n_1$, or to jump from c to b a number of times $(n_1-1)$ times, $(n_1-2)$ is preset in the first index counter 33.

Next, when the memory address 6 coincides with the stop address d, the second coincidence signal 58 is provided. Upon occurrence of the second coincidence signal 58, the control signal 44 is applied via the AND circuit 74 (FIG. 4) and the OR circuit 73 to the program counter 4 to load therein the start address a selected by the multiplexer 16 in accordance with the logic "1" of the select signal 55 derived from the AND circuit 81. On the other hand, the signal from the AND circuit 74 is provided via the OR circuit 77 to the R terminal of the flip-flop 72, which is reset by the operating clock provided immediately after the occurrence of the second coincidence signal 58. When the flip-flop 72 is reset, the control signal 55 from the AND circuit 81 becomes "0" and the address b in the first start address register 29 (FIG. 3) is selected again by the multiplexer 16, as the start address 45. Further, the output from the AND circuit 74 (FIG. 4) is applied as the second DEC signal 61 to the second index counter 26 (FIG. 3) to cause it to decrement by one in synchronism with the operating clock. Since the address in the memory address 6 becomes the address a as mentioned above upon setting the address a, the second DEC signal 61 and the control signal 44 both become "0." When the control signal 44 becomes "0," the program counter 4 increments from the address a.

After repeating the above operation, when the content of the second index counter 26 becomes "0" to provide the second ZERO signal 62 and the memory address 6 coincides with the stop address d to yield the second coincidence signal 58, the control signal 44 is applied via the AND circuit 74 (FIG. 4) and the OR circuit 73 to the program counter 4 (FIG. 3) to load therein the start address a. The flip-flop 75 (FIG. 4) is set via the AND circuit 78 at the timing of the operating clock and reset by the next operating clock. The Q output from the flip-flop 75 is provided as the second request signal 67 via the OR circuit 85 and the AND circuit 86. When the second request signal 67 is thus yielded, new data described in the address 2 of the loop memory 21 (FIG. 3) are loaded, by the second request signal 51 from the OR circuit 27, into the second address register 23, the second stop address register 24, the loop data register 25 and the second index counter 26, and the address counter 22 increments to indicate the next address.

Next, when the content of the first index counter 33 is "0" to yield the ZERO signal 66 and the address produced by the program counter 4 coincides with the first stop address c to yield the first coincidence signal 59, the flip-flop 72 (FIG. 4) is set to produce the Q output. However, since the loop data signal 60 is "0" as a result of the contents of address 2 in the loop memory 21, (FIG. 3) being loaded into the respective registers 23, 24 and 25 as mentioned before, the Q output of the flip-flop 72 is inhibited by the AND circuit 81 thus yielding "0" for the selection signal 55. On the other hand, since the AND circuit 79 (FIG. 4) is supplied with the inversion of the loop data 60 (set to 1 by the above described load of data from memory location 2) therefore, the output from the flip-flop 72 is provided via the AND circuit 79 to the OR circuits 77 and 85 and the AND circuit 82. The output from the OR circuit 77 is provided to the R terminal of the flip-flop 72 and the flip-flop 72 is reset by the next operating clock. The output from the OR circuit 85 is applied to the AND circuit 86, deriving the request signals 68 and 67 from the AND circuits 82 and 86.

When the request signals 68 and 67 are thus produced, the first and second request signals 53 and 51 are respectively provided from the OR circuits 28 and 27, (FIG. 3) by which the contents of the second start address register 23, the second stop address register 24 and the second index counter 26 are respectively loaded into the first start address register 29, the first stop address register 31, and the first index counter 33 and the buffer register 32; namely, the data which have been read from the address 2 of the loop memory 21 into the respective second registers 23, 24 and second counter 26 are loaded with respective first registers 29, 31 and the first counter 33. Thus data stored in the address 3 of the loop memory 21 are newly loaded in the second start address register 23, the second stop address register 24, the second index counter 26 and the loop data register 25. By the operating clock following the occurrence of the first coincidence signal 59, the start address b before the above-mentioned rewriting of the first address register 29, is loaded in the program counter 4, which increments from the next working clock.

As described above, the pattern generating apparatus of this embodiment has registers for loading pairs of start addresses, stop addresses and index data and two sets of circuits for executing the operation of setting the pair of start addresses in the program counter 4 upon coincidence of the memory address from the program counter 4 with the stop address by the number of times indicated by the index data. By the loop data a multiple loop is enabled and, at the same time, the registers in which start and stop addresses and loop data having become unnecessary are reloaded by data from the loop memory, by which address sequences, each having plural loops are generated. In addition, since the reloading of the registers takes place during the execution of the last one of the loop operations to be executed, it is possible to execute a new loop operation immediately after the execution of that last loop operation.

With the pattern generating apparatus of the present invention, in the case of generating an address sequence having a plurality of loops, the start address from the start address register is loaded in the program counter when the memory address from the program counter coincides with the stop address from the stop address register and, after executing this operation a plurality of times, the start address and the stop address are replaced with new ones, so that no memory access is needed during the operation period, permitting a high-speed operation. In the prior art a branch instruction is obtained for the first time after decoding and executing an address generating instruction and a data generating instruction, and the program counter is jumped. In the present invention, however, a certain one of loops and the next address of the loop memory is read out during the execution of the last one of the loops to be executed, so that the jump of the program counter is performed immediately without awaiting the decoding and execution of the address generating instruction and the data generating instruction; accordingly, semiconductor memories can be tested by high-speed operations.

It will be apparent that many modifications and variations may be effected without departing from the scope of the novel concepts of this invention.

What is claimed is:

1. A test pattern generating apparatus for selectively repeating selected sequences of instructions in a microprogram for testing a memory under test, said apparatus comprising an instruction memory for storing said instructions of said microprogram at respective addresses, said instructions of said microprogram comprising address and data generating instructions, a program counter coupled to said instruction memory for providing the sequence of addresses of the instruction memory to be accessed for providing said repeated sequences of said instructions for selectively testing said memory under test, an address pattern generator coupled to said instruction memory for decoding and executing each said accessed address generating instruction and for generating a corresponding address pattern to be applied to said memory under test, a data pattern generator coupled to said instruction memory for decoding and executing each said accessed data generating instruction and for generating a corresponding data pattern to be applied to the memory under test, a loop memory for storing at respective addresses a plurality of sets of loop pattern data for defining said repeated sequences of said instructions, said sets of loop pattern data including first sets thereof, each said first set comprising a first start address and a first stop address indicating a corresponding area of the instruction memory to be sequentially accessed between said first start and stop addresses, and first index data indicating the number of times the respective area is to be accessed, an address counter coupled to said loop memory for sequentially generating the addresses of the loop memory to be accessed for generating said repeated sequences of said instructions, a first set of registers, each coupled to said loop memory, including a first start address register, a first stop address register and a first index data register for sequentially storing the first start address, the first stop address and the first index data of each respective first set of loop pattern data that is accessed by said address counter, said first start address register being coupled between said loop memory and said program counter, and said first stop address register and said first index data register being coupled to said loop memory, a first coincidence circuit coupled to said first stop address register and to said program counter for comparing the first stop address loaded in the first stop address register with the current address in the program counter, for detecting coincidences therebetween and for outputting a corresponding first coincidence signal upon each said coincidence, and a control circuit, coupled to said address counter, to each of said first set of registers and to said program counter, and comprising means for setting each said first start address stored in the first start address register into the program counter responsive to said first coincidence signal for a predetermined number of said first coincidence signals indicated by the respective first index data that was set in the first index data register, for incrementing the content of the address counter, and for replacing the contents of the first start address register, the first stop address register and the first index data register with the respective values of the subsequent first set of said loop pattern data that is accessed by said address counter, wherein said selected repeated sequences of said instructions of said test pattern are generated by said apparatus for selectively testing said memory under test according to the accessing of said instruction memory the respective number of times indicated by each said first index data between the respective first start and stop addresses of said loop pattern data in the order of said accessing of said loop memory by said address counter.

2. The apparatus of claim 1, comprising said loop memory also storing second sets of said loop pattern data, each said second set of loop pattern data comprising a second start address, a second stop address and a second index data, each of said first and second sets of loop pattern data effectively comprising also respectively different loop data values, each said loop data value of a second set being for effectively indicating that a respective repeated sequence of said instructions corresponding to a respective first set of said loop pattern data is to be performed within each repeated sequence of the respective second set, the area of said instruction memory defined by the first start and stop addresses of each said respective first set lying within the area thereof defined by the second start and stop addresses of the respective second set, a second set of registers including a second start address register, a second stop address register, a second index data register and a loop data register for respectively storing the start address, the stop address, the index data and the loop data of at least each of said second loop data sets that is accessed by said address counter from the loop memory, said second start address register being coupled between said loop memory and said first start address register, said second stop address register being coupled between said loop memory and said first stop address register, said second index counter being coupled between said loop memory and said first index data counter, each register of said second set of registers also being coupled to said control circuit, a second coincidence circuit, coupled to said second stop address register and to said program counter, for comparing each said second stop address in the second stop address register with the address from the program counter, for detecting each coincidence therebetween, and for outputting a corresponding second coincidence signal upon each respective coincidence, and said control circuit further comprising means for setting each said second start address loaded in the second start address register into the program counter when said second coincidence signal is output from the second coincidence circuit for a respective predetermined number of times as indicated by the respective second index data in the second index data register, and for performing the accessing of said area of said instruction memory corresponding to the first start and stop addresses and the first index data of the respective first set of said loop pattern data stored in said first set of registers during each sequence of accessing said instruction memory in the area corresponding to said second start and stop addresses of the respective second set of said loop pattern data, wherein said repeated sequences of said instructions of said microprogram are selectively generated for said selective testing of said memory under test, corresponding to the sequentially accessed first and second loop pattern data sets in the loop memory.

3. The apparatus of claim 2, said control circuit further comprising means for storing each said first set of loop pattern data that is accessed by said address counter in the respective ones of said second set of registers and for subsequently transferring each said first start and stop addresses and the first index data of the first set of loop pattern data to said first set of registers for performing the respective repeated sequence of instructions corresponding thereto, said apparatus comprising a buffer register coupled between said first and second index data registers for receiving each said first index data from the second index data register and for transferring same into the first index data register, and said control circuit further comprising first decrementing means for decrementing the content of the first index data register in response to the first coincidence signal down to a first predetermined value, second decrementing means for decrementing the content of the second index data register in response to the second coincidence signal down to a second predetermined value, first index data transfer means for controlling transfer of the content of the buffer register into the first index data register in response to the occurrence of coincidence between said first predetermined value of the content of the first index data register and the coincidence signal output from the first coincidence circuit, inhibit means for inhibiting the supply to the control circuit, for said controlling by the first index data transfer means, of the first occurrence of the coincidence signal output from the first coincidence circuit after each said coincidence between the occurrence of the predetermined value of the decremented content of the first index data register and said output from the first coincidence circuit, and means for releasing the inhibiting of the inhibit means in response to the first occurrence of said coincidence signal output from the second coincidence circuit after each said inhibiting, wherein the loading into the program counter of the start address from the first or second start address register is controlled to perform said repeated accessing of each said area of said instruction memory, corresponding to each one of said second sets of loop pattern data that is stored in said second set of registers and to each first set of loop pattern data that is stored in said first set of registers.

4. The apparatus of claim 3, said control system further comprising means for determining, dependent on the content of the loop data register, whether the next set of loop pattern data from the loop memory is to be read out, in response to each said coincidence between the occurrence of said predetermined value of the content of the first index data register and the coincidence signal from the first coincidence circuit, and means, when one of said first sets of loop pattern data is currently being stored in said second registers, for reading into said second set of registers the respective subsequent one of said loop pattern data sets accessed by said address counter, and for storing in said first set of registers the first start and stop addresses and the first index data of the first set of loop pattern data that is currently stored in said second registers.

5. The apparatus of claim 3, said means for releasing said inhibiting including means for releasing said inhibiting in accordance with the content of said loop data register.

6. The apparatus of claim 2, 3 or 4, said control circuit further comprising means for reading out the next address of the loop memory during the completion of the last sequence of each of the repeated sequences of instructions then being performed, wherein no dummy cycles are required for providing said instruction for testing said memory.

7. The apparatus of claim 2, 3 or 4, said control circuit further comprising means for controlling said address counter, when said repeated sequences of instructions that are being generated correspond to a respective pair of said first and second sets of loop pattern data, (1) to access the next set of said loop pattern data in said loop memory, for loading said next set of loop pattern data into said second set of registers during the last sequence of said repeated instructions corresponding to said second set of loop pattern data of said pair, and (2) to access the further next set of said loop pattern data in said loop memory during the last sequence of said repeated instructions corresponding to said first set of loop pattern data of said pair, and for loading said further next set into said second set of registers while loading the respective members of said next set into said first start and stop address and first index data registers.

* * * * *

UNITED STATES PATENT AND TRADEMARK OFFICE
CERTIFICATE OF CORRECTION

PATENT NO. : 4,402,081
DATED : August 30, 1983
INVENTOR(S) : Yoshichika Ichimiya It is certified that error appears in the above-identified patent and that said Letters Patent is hereby corrected as shown below:

Column 2, line 14, after "again," insert -- and --.

Column 3, line 44, "text" should read -- test --.

Signed and Sealed this

Twenty-fourth Day of January 1984

[SEAL]

Attest:

GERALD J. MOSSINGHOFF

Attesting Officer    Commissioner of Patents and Trademarks